(12) United States Patent
Masaki et al.

(10) Patent No.: US 7,524,396 B2
(45) Date of Patent: Apr. 28, 2009

(54) OBJECT PROCESSING APPARATUS AND PROCESSING METHOD

(75) Inventors: Yuichi Masaki, Kawasaki (JP); Yasushi Fujisawa, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 289 days.

(21) Appl. No.: 11/053,268

(22) Filed: Feb. 9, 2005

(65) Prior Publication Data

US 2005/0178409 A1    Aug. 18, 2005

(30) Foreign Application Priority Data

Feb. 12, 2004 (JP) .............................. 2004-035547

(51) Int. Cl.
*B08B 3/00* (2006.01)
*F25J 3/00* (2006.01)
*H01L 21/304* (2006.01)

(52) U.S. Cl. .................. 156/345.17; 134/76; 134/98.1; 156/345.11

(58) Field of Classification Search ............ 156/345.11, 156/345, 345.17; 134/902, 76, 98.1, 182, 134/186
See application file for complete search history.

(56) References Cited

U.S. PATENT DOCUMENTS 5,327,921 A * 7/1994 Mokuo et al. ............... 134/182
2001/0008142 A1 * 7/2001 Pokorny .................. 134/102.2
2002/0104556 A1 * 8/2002 Puri et al. ..................... 134/36
2005/0178409 A1 * 8/2005 Masaki et al. ................. 134/76

FOREIGN PATENT DOCUMENTS

| JP | 7-161677  | 6/1995  |
| JP | 7-297164  | 11/1995 |
| JP | 9-232272  | 9/1997  |
| JP | 10-209105 | 8/1998  |

* cited by examiner

*Primary Examiner*—Sylvia R. MacArthur
(74) *Attorney, Agent, or Firm*—Fitzpatrick, Cella, Harper & Scinto

(57) ABSTRACT

A processing apparatus includes a processing bath having a liquid injection port in the bottom thereof, a rectifier plate located between the bottom of the processing bath and a position at which an object to be processed is positioned, and a distribution portion extending between the rectifier plate and the liquid injection port and over the liquid injection port. The distribution portion includes an opposing portion opposing the liquid injection port, a surrounding portion surrounding a space between the opposing portion and the liquid injection port, and a guard portion or extended portion extending outwardly from the bottom end of the surrounding portion.

6 Claims, 4 Drawing Sheets

OBJECT PROCESSING APPARATUS AND PROCESSING METHOD

FIELD OF THE INVENTION

The present invention relates to a processing apparatus and processing method for processing an object with a liquid and, more particularly, to a processing apparatus and processing method which are suitable for cleaning, etching, or anodizing an object.

BACKGROUND OF THE INVENTION

As the feature size of a micro-device such as a semiconductor device shrinks, a technique in a manufacturing process for removing fine foreign substances (particles) by cleaning and preventing the foreign substances from attaching to an object such as a substrate while processing the object has become significant.

In order to solve the problem of the foreign substances, it is required to cause the foreign substances detached from an object to be processed or foreign substances present in a processing liquid to overflow from a processing bath to discharge them outside the processing bath quickly. Generally, an upward injection scheme of injecting the processing liquid from the bottom of the processing bath is considered effective. With this scheme, the flow rate and flow velocity of the processing liquid can be increased.

With the upward injection scheme, however, uniform flow rate and flow velocity of the processing liquid cannot be ensured sufficiently.

Japanese Patent Laid-Open No. 7-161677 discloses a cleaning apparatus in which a rectifier plate having a large number of holes is arranged between a wafer and a supply pipe arranged at the bottom of a cleaning bath. In the apparatus described in this reference, the pressure of a liquid supplied to the wafer through the rectifier plate is not uniformed. In a region where the liquid pressure is high, the wafer vibrates to easily cause friction between the wafer and a carrier. This friction can cause chipping to generate particles. The nonuniform pressure causes turbulent flow of the liquid to interfere with quick discharge of the particles outside the processing bath.

According to Japanese Patent Laid-Open No. 7-297164, a plurality of rectifier plates are arranged to prevent the cleaning liquid from standing or whirling. According to Japanese Patent Laid-Open No. 9-232272, a plurality of rectifier plates are arranged. The higher the position where the rectifier plate is arranged, the smaller the hole diameter of the rectifier plate. The plate thickness of the rectifier plate arranged at the uppermost position is made as large as twice or more the hole diameter of the rectifier plate. Consequently, a laminar flow is formed. In each of the apparatuses described in Japanese Patent Laid-Open Nos. 7-297164 and 9-232272, however, because the size of the processing bath in the depth direction increases, the apparatus size increases, and the quantity of necessary processing liquid increases. This prolongs a time required for changing the processing liquid.

Japanese Patent Laid-Open No. 10-209105 discloses a cleaning apparatus in which a buffer plate is arranged between a rectifier plate and injection port. Even with this method, the same problems as that described above arise.

SUMMARY OF THE INVENTION

The present invention has been made in view of the above problems, and has as its object to provide a highly uniform flow to an object to be processed while downsizing a processing apparatus, so that particles can be removed efficiently.

According to the first aspect of the present invention, there is provided a processing apparatus for processing an object with a liquid, comprising a processing bath having a liquid injection port at a bottom of the processing bath, a rectifier plate located between the bottom and a position at which an object to be processed is positioned, and a distribution portion extending between the rectifier plate and the liquid injection port and over the liquid injection port. The distribution portion includes an opposing portion opposing the liquid injection port, a surrounding portion surrounding a space between the opposing portion and the liquid injection port, and an extended portion extending outwardly from a bottom end of the surrounding portion.

According to a preferred embodiment of the present invention, the surrounding portion preferably has a substantially circular section. The extended portion preferably has a substantially circular outer portion.

According to another preferred embodiment of the present invention, a distance between a lower surface of the extended portion and the bottom is preferably shorter than a distance between a bottom surface of the extended portion and the rectifier plate.

According to still another preferred embodiment of the present invention, the distribution portion is preferably supported by the rectifier plate. The distribution portion is preferably supported at the opposing portion by the rectifier plate.

According to the second aspect of the present invention, there is provided a processing method of processing an object with a liquid, comprising an arranging step of arranging, in a processing bath having a liquid injection port in a bottom thereof, an object to be processed above a rectifier plate which is arranged above the bottom to partition the processing bath into an upper bath portion and a lower bath portion, and a processing step of distributing the liquid, supplied into the processing bath through the liquid injection port, by a distribution portion arranged between the rectifier plate and the liquid injection port, thus processing the object with the liquid while supplying the liquid to the object through the rectifier plate, wherein the distribution portion uses a distribution plate including an opposing portion opposing the liquid injection port, a surrounding portion surrounding a space between the opposing portion and the liquid injection port, and an extended portion extending outwardly from a bottom end of the surrounding portion.

According to a preferred embodiment of the present invention, the processing step can include a step of cleaning, etching, or anodizing the object with the liquid.

According to the present invention, for example, a highly uniform flow is provided to an object to be processed while downsizing a processing apparatus, so that particles can be removed efficiently.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

The preferred embodiment of the present invention will be described with reference to the accompanying drawings.

A processing apparatus and processing method according to the present invention are suitable for processing an object like a substrate, e.g., a semiconductor substrate or glass substrate, with a liquid. An example of a process that uses a liquid suitably includes cleaning, etching, anodizing, and the like.

Figure 1:
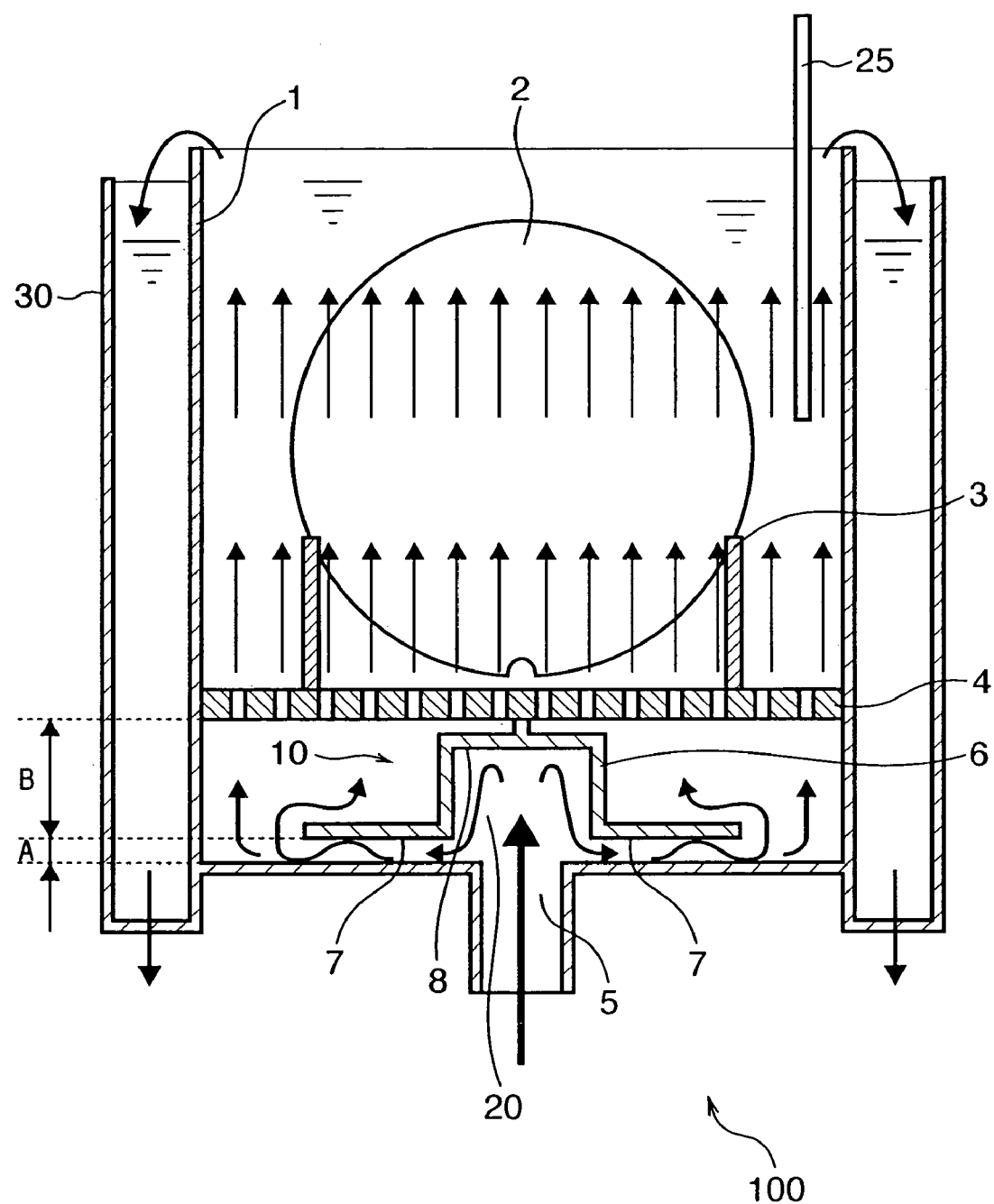
FIG. 1 is a view showing the schematic structure of a wet processing apparatus according to a preferred embodiment of the present invention.

FIG. 1 is a view showing the schematic structure of a wet processing apparatus according to a preferred embodiment of the present invention. The processing apparatus shown in FIG. 1 is formed as an apparatus that processes a wafer 2 as an object to be processed with a liquid, e.g., a cleaning apparatus which cleans with a cleaning liquid, an etching apparatus which etches with an etching liquid, or an anodizing apparatus which anodizes in an electrolyte.

A processing apparatus 100 shown in FIG. 1 includes a processing bath 1 which has an liquid injection port 5 at its bottom, a rectifier plate 4 which is arranged between a position where the wafer 2 is to be arranged and the bottom of the processing bath 1 and partitions the processing bath 1 into upper and lower bath portions, and a distribution portion 10 which extends between the rectifier plate 4 and liquid injection port 5 and over the liquid injection port 5. A plurality of wafers 2 can be processed one by one, or simultaneously. The latter scheme is called a batch scheme. The wafer 2 can be held by a holder 3 to be typically perpendicular to the bottom surface of the processing bath 1. The holder 3 can be fixed to a member in the processing bath 1, or formed as a carrier that can be separated from the processing bath 1. The holder 3 is preferably formed of a member extending from the rectifier plate 4 in the vertical direction. This holder 3 does not disturb a laminar flow in the vertical direction formed in the processing bath 1.

Typically, the liquid injection port 5 can be arranged such that its center coincides with the central portion of the bottom of the processing bath 1, or a portion immediately under or in the vicinity of the center axis of the wafer 2. The distribution portion 10 has an opposing portion 8 which opposes the liquid injection port 5, a surrounding portion 6 which surrounds the side of a pressure buffering portion 20 between the opposing portion 8 and liquid injection port 5, and a guard portion or extended portion 7 which extends from the bottom end of the surrounding portion 6 in the outward direction.

The distribution portion 10 can be supported in a hanging state by, e.g., the rectifier plate 4. Preferably, the distribution portion 10 is supported at the central portion of the opposing portion 8 by the rectifier plate 4. This support structure contributes to exerting the pressure of the liquid on the lower surface of the rectifier plate 4 uniformly without interfering with the flow of the liquid on the lower surface of the rectifier plate 4.

The opposing portion 8 can form a plate-like shape such as a disk, elliptic plate, or rectangular plate, a curved-surface shape such as an upward projecting hemispherical shape or hanging bell, or any other shape. The size of the opposing portion 8 in the horizontal direction (an area formed by projection in the vertical direction) is preferably designed to be larger than the sectional area of the liquid injection port 5. The shape of the opposing portion 8 in the horizontal direction can be determined in accordance with the number of wafers 2 to be processed.

The surrounding portion 6 can be formed to conform to the outer shape of the opposing portion 8. As the liquid injection port 5 can typically has a circular shape, the opposing portion 8 preferably has a circular shape to be axi-symmetrical with respect to the center axis of the liquid injection port 5. The surrounding portion 6 preferably has a cylindrical shape or a conical shape with an open bottom to have a circular section.

The guard portion 7 can be formed to extend outwardly from the bottom end of the surrounding portion 6 substantially horizontally, and can have a ring-like shape if the bottom end of the surrounding portion 6 forms a circle.

The pressure buffering portion 20 defined by the opposing portion 8 and surrounding portion 6 has a sufficiently large capacity for buffering the pressure of a processing liquid (e.g., a cleaning liquid, etching liquid, or electrolyte) supplied into the processing bath 1 through the liquid injection port 5. The liquid the pressure of which is buffered in the pressure buffering portion 20 is fed outwardly from the bottom end of the surrounding portion 6 radially (axi-symmetrically) along the bottom end of the guard portion 7.

In an arrangement in which, e.g., a disk member is arranged, in place of the distribution portion 10 having the above structure, at the height of the guard portion 7, the pressure of the liquid supplied into the processing bath 1 through the liquid injection port 5 cannot be buffered, and turbulent flow can be generated accordingly. As the fluid resistance increases, the circulating velocity of the liquid can be decreased. In place of the distribution portion 10, if a disk member is arranged at a position closer to the rectifier plate 4 than the bottom of the processing bath 1, that is, at the height of the opposing portion 8, a liquid having a nonuniform pressure distribution in the lateral direction is supplied to the lower surface of the rectifier plate 4. Therefore, a liquid flow having a uniform flow cannot be formed by the rectifier plate 4.

More specifically, the distribution portion 10 having the opposing portion 8, surrounding portion 6, and guard portion 7 provides one solution for providing a liquid having high pressure uniformity to the lower surface of the rectifier plate 4 while suppressing turbulent flow by buffering the pressure of the liquid in the pressure buffering portion 20 which is defined by the opposing portion 8 and surrounding portion 6. In the prior art disclosed in patent references 2 to 4, in order to provide a liquid having high pressure uniformity to the lower surface of the rectifier plate, a sufficiently long distance must be ensured between the processing bath and rectifier plate. This increases the size of the processing apparatus, the quantity of processing liquid, and the replacing time of the processing liquid. With the apparatus described in Japanese Patent Laid-Open No. 7-161677, a laminar flow may be difficult to form.

The liquid provided to the lower surface of the rectifier plate 4 forms a laminar flow through the large number of holes formed in the rectifier plate 4 with a predetermined matrix pattern and moves upward. Since this laminar flow does not vibrate the wafer 2, no particles are generated by friction of the wafer 2 and holder 3. Even if particles are mixed in the liquid, they are discharged upward quickly.

The liquid that has moved upward in the processing bath 1 overflows from the processing bath 1 and is collected by an overflow bath 30. The liquid collected by the overflow bath 30 is processed by, e.g., filtration, and can be supplied into the processing bath 1 by the pump through the liquid injection port 5.

A processing method that uses the processing apparatus 100 as described above can include a setting step of setting the wafer 2 as an object to be processed on the holder 3 and a processing step of processing the wafer 2 with the liquid. In the processing step, the processing liquid is supplied into the processing bath 1 through the liquid injection port 5. The pressure of the liquid is buffered in the pressure buffering portion 20 of the distribution portion 10. The liquid is distributed radially from the distribution portion 10 through a gap between the guard portion 7 and the bottom surface of the processing bath 1. The liquid then forms a laminar flow through the rectifier plate 4 to process the holder 3 while being supplied to the wafer 2. When a cleaning liquid is used as the processing liquid, the wafer 2 can be cleaned. When an etching liquid is used, the wafer 2 can be wet-etched. When a current is supplied through the wafer 2 by using a predetermined electrolyte (e.g., a liquid containing hydrofluoric acid), one surface of the wafer 2 can be electropolished or made porous (anodized).

Figure 2:
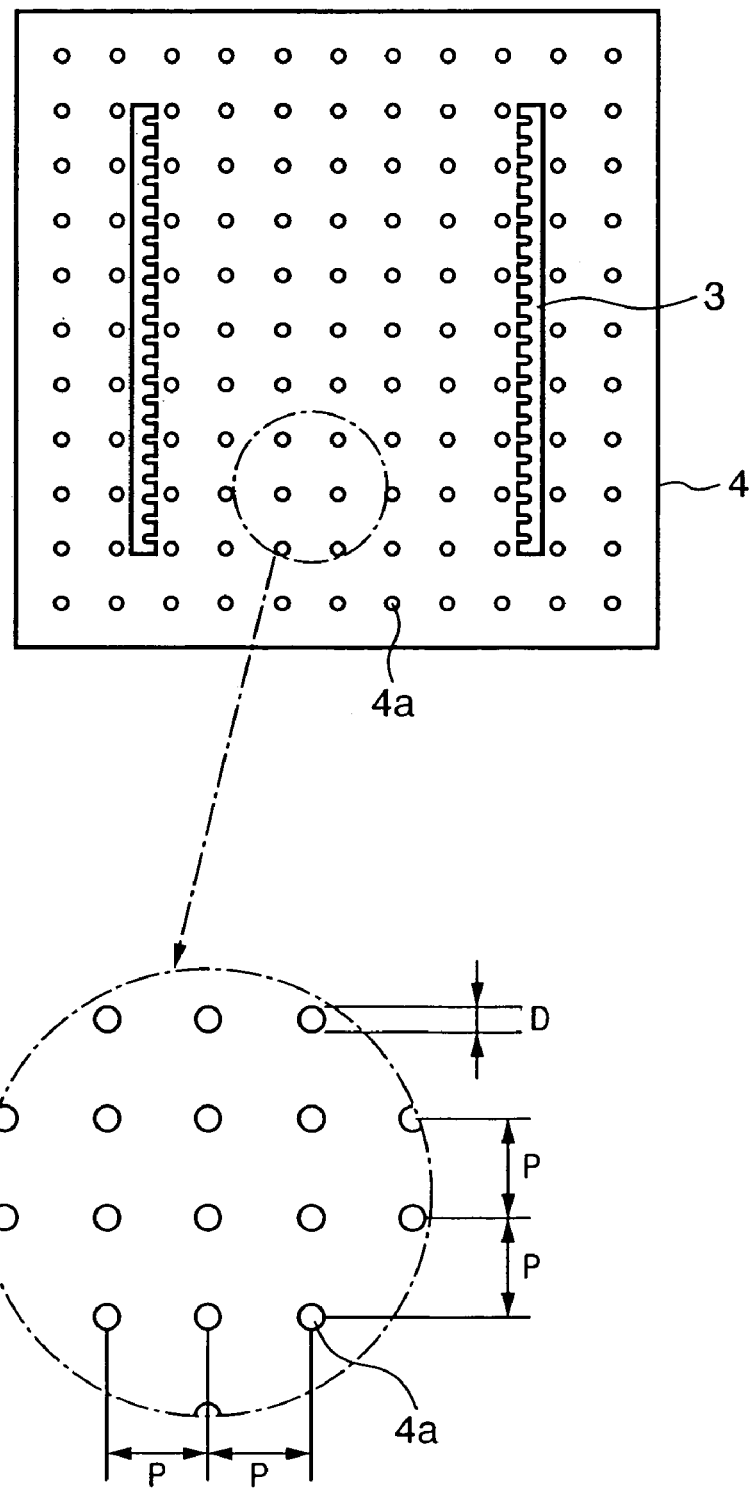
FIG. 2 is a plan view showing an arrangement of a rectifier plate.

FIG. 2 is a plan view showing an arrangement of the rectifier plate 4. For examples, holes 4a each having a diameter D=5 mm can be arranged at a pitch P=15 mm like a grid in the rectifier plate 4. In a case wherein a rectifier plate 4 as shown in FIG. 2 is employed, the particle removing effect in the processing bath 1, which is obtained while changing a distance A between the lower surface of the guard portion 7 and the bottom surface of the processing bath 1 and a distance B between the lower surface of the rectifier plate 4 and the lower surface of the guard portion 7, will be described. Note that (distance A)+(distance B)=constant.

An intake pipe 25 was set in the processing bath 1 as shown in FIG. 1. The particles were measured by feeding the liquid in the processing bath 1 to a particle counter through the intake pipe 25. In this case, three types of distribution portions 10 shown in following (1) to (3) were prepared.

(1) A=5 mm, B=25 mm
(2) A=10 mm, B=20 mm
(3) A=15 mm, B=15 mm

Figure 3:
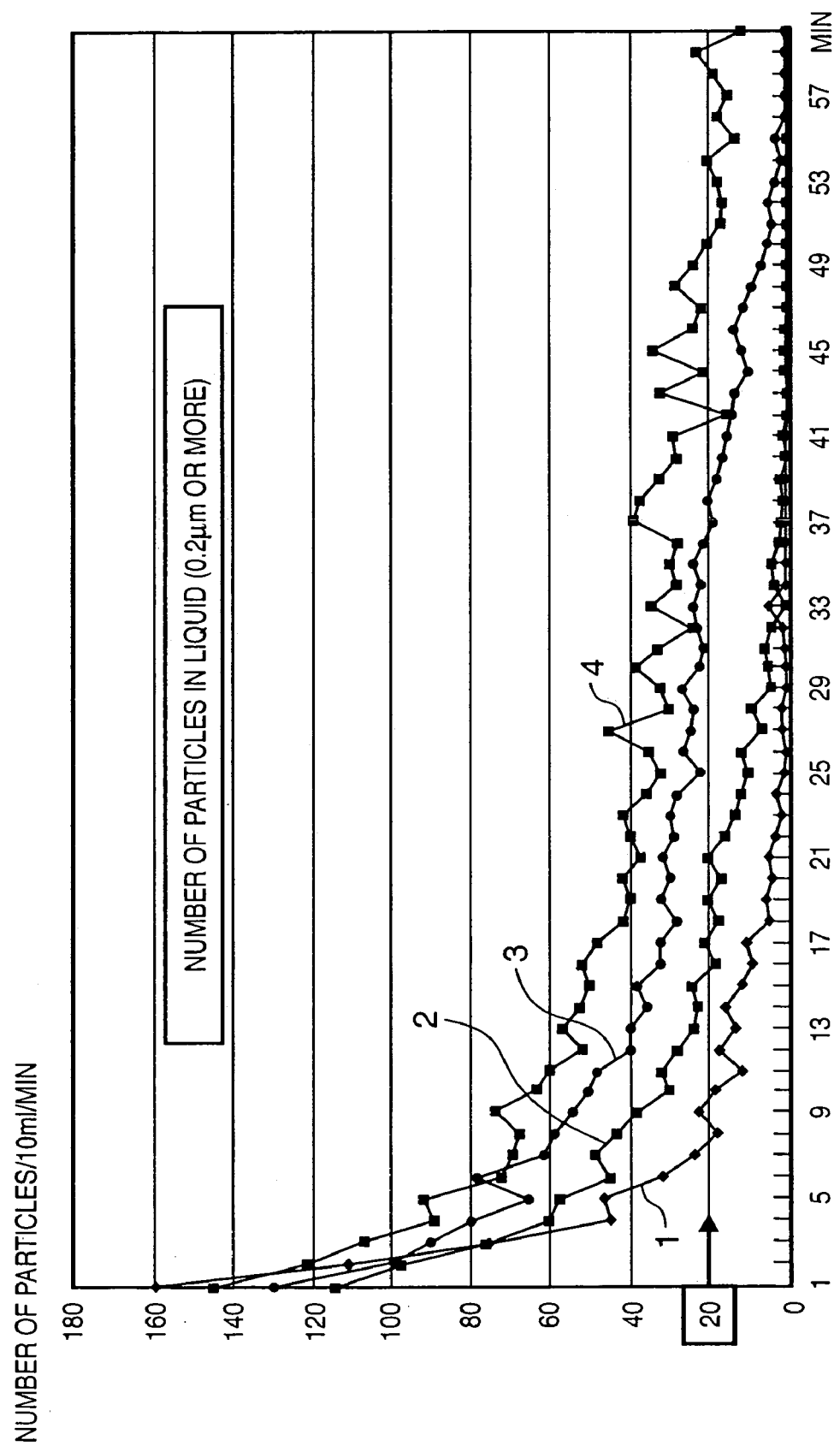
FIG. 3 is a graph for comparing particle removing effects that change depending on a difference in structure of distribution portions which distribute a liquid.

Pure water was injected into the processing bath 1 through the liquid injection port 5 at a flow rate of about 20 l/min. After the processing bath 1 was filled, the semiconductor wafer 2 was set on the holder 3. Then, circulation of the pure water was started and simultaneously measurement of particles (each having a particle size of 0.2 $\mu$m or more) in the pure water was started. FIG. 3 shows the results of this measurement. As shown in FIG. 3, the time that took until the number of particles fell below 20/10 ml/min was 10 min with arrangement (1), 19 min with arrangement (2), and 38 min with arrangement (3).

From these results, the longer the distance from the guard portion 7 to the rectifier plate 4, the higher the particle removing effect. In order to increase the distance B, if the distance A is excessively decreased, the flow velocity of the liquid flowing through the gap between the guard portion 7 and the bottom surface of the processing bath 1 becomes excessively fast. Then, the liquid flow may collide against the side wall of the processing bath 1 to cause turbulent flow.

The demand for the particle removing effect changes depending on specifications required of the object to be processed. In general use, a sufficiently high effect is obtained with arrangements (1) to (3). Under this judgment, it may suffice if the distance A is equal to or smaller than the distance B.

The guard portion 7 preferably has a lateral size almost equal to the horizontal size of the object to be processed and is circular.

In all arrangements (1) to (3) described above, after injection of the liquid was started, the liquid passing outside the guard portion 7 flowed to the side surface of the surrounding portion 6 to overflow from all the holes 4a of the rectifier plate 4 substantially simultaneously. This result supports that the liquid is supplied to the lower surface of the rectifier plate 4 at a uniform timing and pressure.

Figure 4:
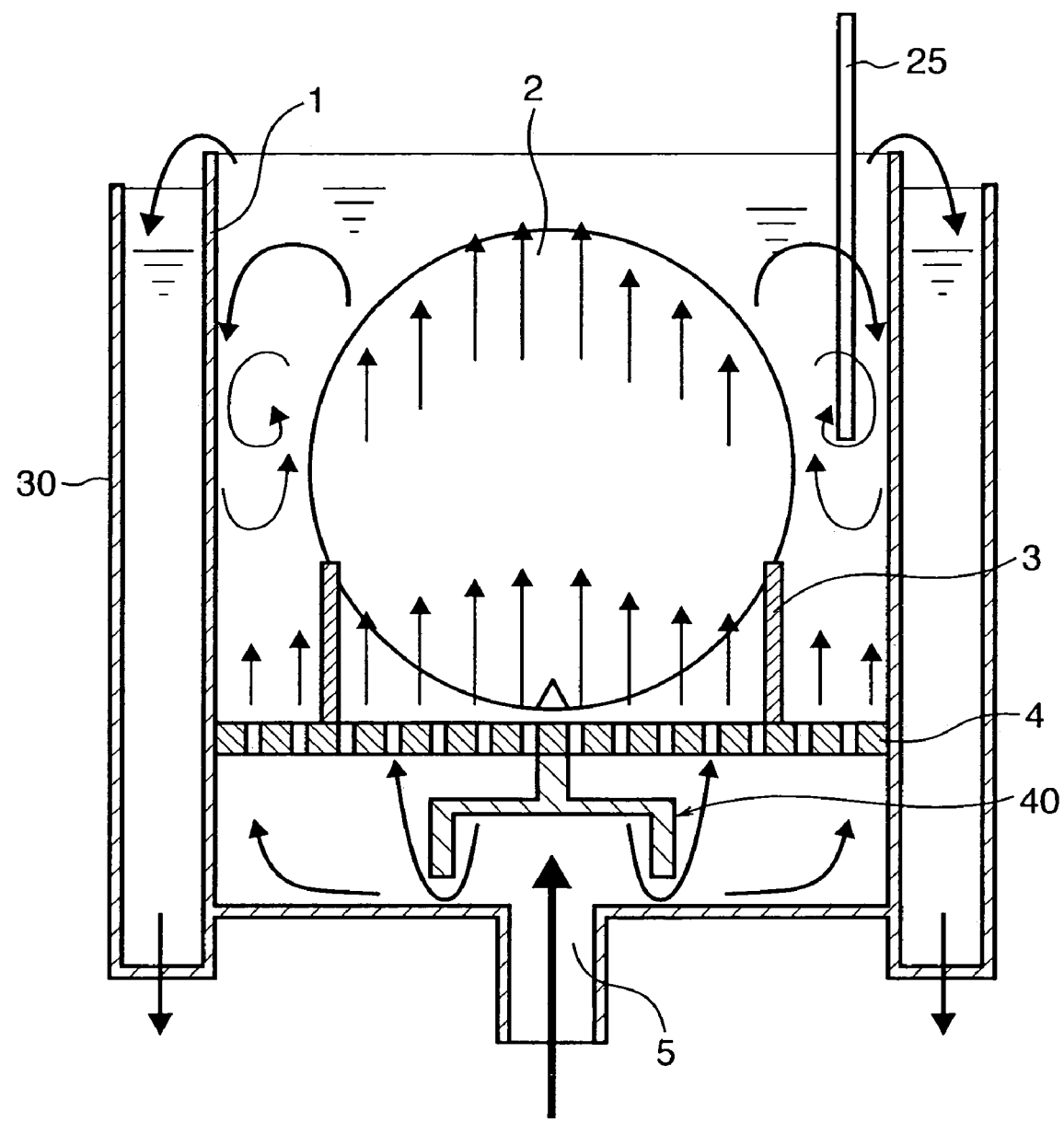
FIG. 4 is a view schematically showing the structure of a processing apparatus which is fabricated as a comparative example to check the effect obtained by forming a guard portion extending from the bottom end of a surrounding portion.

FIG. 4 is a view schematically showing the structure of a processing apparatus which is fabricated as a comparative example to check the effect obtained by forming the guard portion or extended portion extending from the bottom end of the surrounding portion. With the arrangement shown in FIG. 4, pure water was injected into a processing bath 1 through a liquid injection port 5 at a flow rate of about 20 l/min. After the processing bath 1 was filled, a wafer 2 was set on a holder 3. Then, circulation of the pure water was started and simultaneously measurement of particles (each having a particle size of 0.2 $\mu$m or more) in the pure water was started. In FIG. 3, the result of this measurement is indicated by (4). In the arrangement shown in FIG. 4, the time that took, until the number of particles fell below 20/10 ml/min was about 50 min.

In the arrangement shown in FIG. 4, the liquid flowing out through the gap between a distribution portion 40 and the bottom surface of the processing bath 1 tends to concentrate toward the central portion in the processing bath 1. More specifically, after supply of the liquid was started, the liquid was first injected from the central portion of the rectifier plate 4, and thereafter the injecting portion gradually enlarged to the periphery. This means that the liquid is supplied to the lower surface of a rectifier plate 4 at a nonuniform timing and pressure, and accordingly the flow of the liquid passing through the rectifier plate 4 can cause turbulent flow. This turbulent flow and the experiment results shown in FIG. 3 are assumed to correlate to each other.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-035547 filed on Feb. 12, 2004, the entire contents of which are hereby incorporated by reference herein.

What is claimed is:

1. A processing apparatus for processing an object with a liquid, comprising:
   a processing bath having a liquid injection port at a bottom of said processing bath;
   a rectifier plate located between the bottom and a position at which an object to be processed is positioned; and
   a distribution portion extending between said rectifier plate and said liquid injection port and over said liquid injection port, and spaced apart from the bottom of said processing bath,
   said distribution portion including an opposing portion opposing said liquid injection port, a surrounding portion having a tubular shape surrounding a space between said opposing portion and said liquid injection port, and an extended portion extending radially and outwardly from a bottom end of said surrounding portion.

2. The apparatus according to claim 1, wherein said surrounding portion has a substantially circular section.

3. The apparatus according to claim 1, wherein said extended portion has a substantially circular outer portion.

4. The apparatus according to claim 1, wherein a distance between a lower surface of said extended portion and said bottom is shorter than a distance between a bottom surface of said extended portion and said rectifier plate.

5. The apparatus according to claim 1, wherein said distribution portion is supported by said rectifier plate.

6. The apparatus according to claim 5, wherein said distribution portion is supported at said opposing portion by said rectifier plate.

* * * * *